(12) United States Patent
Song (10) Patent No.: US 11,539,019 B2
(45) Date of Patent: Dec. 27, 2022

(54) DISPLAY SUBSTRATE, MANUFACTURING METHOD THEREOF, AND DISPLAY DEVICE

(71) Applicant: BOE TECHNOLOGY GROUP CO., LTD., Beijing (CN)

(72) Inventor: Wenfeng Song, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 844 days.

(21) Appl. No.: 16/333,112

(22) PCT Filed: Aug. 17, 2018

(86) PCT No.: PCT/CN2018/101020
§ 371 (c)(1),
(2) Date: Mar. 13, 2019

(87) PCT Pub. No.: WO2019/114310
PCT Pub. Date: Jun. 20, 2019

(65) Prior Publication Data
US 2021/0367184 A1 Nov. 25, 2021

(30) Foreign Application Priority Data
Dec. 12, 2017 (CN) .......................... 201711318101.3

(51) Int. Cl.
*H01L 51/52* (2006.01)
*H01L 51/56* (2006.01)
*H01L 27/32* (2006.01)

(52) U.S. Cl.
CPC ...... *H01L 51/5228* (2013.01); *H01L 27/3246* (2013.01); *H01L 27/3283* (2013.01);
(Continued)

(58) Field of Classification Search
CPC . H01L 51/5228; H01L 51/5218; H01L 51/56; H01L 2251/5315; H01L 27/3246; H01L 27/3283
See application file for complete search history.

(56) References Cited

U.S. PATENT DOCUMENTS 5,949,188 A * 9/1999 Leising ............... H01L 27/3283
313/505
8,987,717 B2 3/2015 Kang
(Continued)

FOREIGN PATENT DOCUMENTS

| CN | 103681743 A | 3/2014 |
|---|---|---|
| CN | 107359258 A | 11/2017 |
| JP | 5791514 B2 | 10/2015 |

OTHER PUBLICATIONS

International Search Report of PCT/CN2018/101020 in Chinese, dated Nov. 15, 2018 with English translation.
(Continued)

*Primary Examiner* — Mary A Wilczewski
(74) *Attorney, Agent, or Firm* — Collard & Roe, P.C.

(57) ABSTRACT

A display substrate, a manufacturing method thereof, and a display device are disclosed. The display substrate includes a base substrate; a pixel defining layer on the base substrate, the pixel defining layer includes a plurality of openings, the pixel defining layer includes a first pixel defining layer, a conductive layer, and a second pixel defining layer which are stacked, in the pixel defining layer in at least a peripheral region of the display substrate, an orthographic projection of the conductive layer on the base substrate completely falls within an orthographic projection of the second pixel defining layer on the base substrate; and an electroluminescent unit including a transparent electrode the transparent elec-
(Continued)

trode is electrically connected with the conductive layer in the pixel defining layer in at least the peripheral region of the display substrate.

17 Claims, 3 Drawing Sheets

(52) U.S. Cl.
CPC .......... *H01L 51/56* (2013.01); *H01L 51/5218* (2013.01); *H01L 2251/5315* (2013.01)

(56) References Cited

U.S. PATENT DOCUMENTS

| | | | |
|---|---|---|---|
| 9,929,370 B2 | 3/2018 | Nakamura | |
| 2002/0056842 A1* | 5/2002 | Yamazaki | H01L 51/5253 257/79 |
| 2004/0113545 A1* | 6/2004 | Pang | H01L 27/3246 313/504 |
| 2004/0207577 A1* | 10/2004 | Ito | H01L 27/3244 345/76 |
| 2005/0258741 A1* | 11/2005 | Kim | H01L 27/3246 313/503 |
| 2010/0193791 A1* | 8/2010 | Chun | H01L 27/3246 257/59 |
| 2010/0308717 A1* | 12/2010 | Kitazume | H01L 51/5092 313/504 |
| 2011/0206846 A1* | 8/2011 | Elam | C23C 16/45553 427/255.32 |
| 2013/0299791 A1 | 11/2013 | Hirakata et al. | |
| 2015/0001507 A1 | 1/2015 | Kim et al. | |
| 2015/0060822 A1* | 3/2015 | Kamiya | H01L 51/5225 257/40 |
| 2016/0043161 A1 | 2/2016 | Miyazawa | |
| 2017/0077196 A1* | 3/2017 | Kanda | H01L 51/5253 |
| 2017/0125507 A1 | 5/2017 | Lee et al. | |
| 2017/0179209 A1 | 6/2017 | Kim | |
| 2021/0336182 A1* | 10/2021 | Liu | H01L 51/56 |
| 2021/0336187 A1* | 10/2021 | Tang | H01L 51/56 |
| 2021/0343972 A1* | 11/2021 | Zheng | H01L 51/5225 |
| 2021/0351378 A1* | 11/2021 | Lee | H01L 51/525 |

OTHER PUBLICATIONS

Notice of Transmittal of the International Search Report of PCT/CN2018/101020 in Chinese, dated Nov. 15, 2018.

Written Opinion of the International Searching Authority of PCT/CN2018/101020 in Chinese, dated Nov. 15, 2018 with English translation.

Extended European Search Report in European Application No. 18849394.4 dated Sep. 9, 2021.

* cited by examiner

DISPLAY SUBSTRATE, MANUFACTURING METHOD THEREOF, AND DISPLAY DEVICE

CROSS REFERENCE TO RELATED APPLICATIONS

This application is the National Stage of PCT/CN2018/101020 filed on Aug. 17, 2018, which claims priority under 35 U.S.C. § 119 of Chinese Application No. 201711318101.3 filed on Dec. 12, 2017, the disclosure of which is incorporated by reference.

TECHNICAL FIELD

At least one embodiment of the present disclosure relates to a display substrate, a manufacturing method thereof, and a display device.

BACKGROUND

Organic light emitting diode (OLED) devices have a series of advantages such as all-solid structure, high brightness, full visual angle, fast response speed, flexible, and thus have become display products with extreme development prospect.

At present, in large-sized organic light emitting diode devices, it has become the target of more and more manufacturers to not only meet the demands of transmittance of a transparent electrode, but also guarantee that the transparent electrode has a relatively small voltage drop.

SUMMARY

At least one embodiment of the present disclosure provides a display substrate, a manufacturing method thereof, and a display device.

At least one embodiment of the present disclosure provides a display substrate, including: a base substrate; a pixel defining layer on the base substrate, the pixel defining layer includes a plurality of openings, in the pixel defining layer in at least a peripheral region of the display substrate, an orthographic projection of a conductive layer on the base substrate completely falls within an orthographic projection of a second pixel defining layer on the base substrate; and an electroluminescent unit, located in the openings, the electroluminescent unit includes a light emitting layer and a transparent electrode on a side of the light emitting layer away from the base substrate, the transparent electrode is electrically connected with the conductive layer in the pixel defining layer in at least the peripheral region of the display substrate.

In some examples, an orthographic projection of the entire conductive layer on the base substrate completely falls within the orthographic projection of the second pixel defining layer on the base substrate.

In some examples, a cross section of the second pixel defining layer has a trapezoid shape, and a length of a base of the trapezoid shape away from the base substrate is greater than a length of a base of the trapezoid shape close to the base substrate.

In some examples, a surface of the conductive layer facing the second pixel defining layer and a surface of the second pixel defining layer facing the conductive layer are the same in shape and size.

In some examples, a distance between a surface of the second pixel defining layer facing the conductive layer and the base substrate is greater than a distance between a surface of the light emitting layer in the openings away from the base substrate and the base substrate.

In some examples, a distance between a surface of the first pixel defining layer facing the conductive layer and the base substrate is greater than a distance between a surface of the light emitting layer in the openings away from the base substrate and the base substrate.

In some examples, a distance between a surface of the second pixel defining layer away from the conductive layer and the base substrate is greater than a distance between a surface of the light emitting layer in the openings away from the base substrate and the base substrate.

In some examples, an orthographic projection of the first pixel defining layer on the base substrate coincides with the orthographic projection of the second pixel defining layer on the base substrate.

In some examples, the orthographic projection of the conductive layer on the base substrate falls within an orthographic projection of the first pixel defining layer on the base substrate.

In some examples, a thickness of the conductive layer in a direction perpendicular to the base substrate is uniformly distributed.

In some examples, in a direction perpendicular to the base substrate, a thickness of a portion of the transparent electrode located at a middle portion of the display substrate is greater than a thickness of a portion of the transparent electrode located in the peripheral region of the display substrate.

In some examples, in a direction perpendicular to the base substrate, a thickness of a portion of the conductive layer located at the middle portion of the display substrate is smaller than a thickness of a portion of the conductive layer located in the peripheral region of the display substrate.

In some examples, the transparent electrode is electrically connected with the conductive layer in the pixel defining layer only in the peripheral region of the display substrate.

In some examples, a side of the second pixel defining layer away from the base substrate is provided with a light emitting material layer, a material of the light emitting material layer is the same with a material of the light emitting layer, and the transparent electrode is a continuous electrode layer on the entire surface of the light emitting layer and the light emitting material layer.

In some examples, the electroluminescent unit further includes a reflective electrode on a side of the light emitting layer facing the base substrate.

In some examples, a material of the conductive layer is the same as a material of the reflective electrode.

At least one embodiment of the present disclosure provides a display device, including the display substrate according to any one of the above-mentioned embodiments.

At least one embodiment of the present disclosure provides a manufacturing method of a display substrate, including: forming a first pixel defining material layer, a conductive material layer, and a second pixel defining material layer on a base substrate; patterning the first pixel defining material layer, the conductive material layer, and the second pixel defining material layer to form a pixel defining layer having a plurality of openings, wherein, in the pixel defining layer in at least a peripheral region of the display substrate, an orthographic projection of a conductive layer formed by patterning the conductive material layer on the base substrate completely falls within an orthographic projection of a second pixel defining layer formed by patterning the second pixel defining material layer on the base substrate; evaporating a light emitting material layer in the openings to form a light emitting layer; and depositing a transparent electrode on a side of the light emitting layer and the second pixel defining layer away from the base substrate, such that the transparent electrode is electrically connected with the conductive layer in the pixel defining layer in at least the peripheral region of the display substrate.

In some examples, before forming the pixel defining layer, forming a reflective electrode on the base substrate, wherein the openings expose the reflective electrode.

In some examples, using an atomic layer deposition method to deposit the transparent electrode.

In some examples, forming the first pixel defining layer and the second pixel defining layer includes: forming the first pixel defining layer and the second pixel defining layer by using a same mask pattern.

BRIEF DESCRIPTION OF THE DRAWINGS

Hereinafter, the drawings accompanying embodiments of the present disclosure are simply introduced in order to more clearly explain technical solution(s) of the embodiments of the present disclosure. Obviously, the described drawings below are merely related to some of the embodiments of the present disclosure without constituting any limitation thereto.

DETAILED DESCRIPTION

In order to make objects, technical details and advantages of the embodiments of the invention apparent, technical solutions according to the embodiments of the present invention will be described clearly and completely as below in conjunction with the accompanying drawings of embodiments of the present invention. It is to be understood that the described embodiments are only a part of but not all of exemplary embodiments of the present invention. Based on the described embodiments of the present invention, various other embodiments can be obtained by those of ordinary skill in the art without creative labor and those embodiments shall fall into the protection scope of the present invention.

Unless otherwise defined, all the technical and scientific terms used herein have the same meanings as commonly understood by one of ordinary skill in the art to which the present invention belongs. The terms, such as "first," "second," or the like, which are used in the description and the claims of the present application, are not intended to indicate any sequence, amount or importance, but for distinguishing various components. Also, the terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly.

In the study, the inventor(s) of the present application has found that in an organic light emitting diode device having a large-sized display substrate, the transparent electrode located at the middle portion of the display substrate and the transparent portion located in the peripheral region of the display substrate have different thickness due to the requirements for the transmittance of the transparent electrode. For example, the thickness of the transparent electrode located at the middle portion of the display substrate is greater than the thickness of the transparent electrode located in the peripheral portion of the display substrate, which tends to cause a large voltage drop of the transparent electrode in the peripheral region of the display substrate, thereby greatly affecting the performance and serve life of the display device. The peripheral region herein refers to a region located at the periphery of the middle portion of the display substrate, that is, a region located at the edges of the display substrate.

Embodiments of the present disclosure provide a display substrate, a manufacturing method of the same, and a display device. The display substrate includes: a base substrate; a pixel defining layer on the base substrate, the pixel defining layer includes a plurality of openings, wherein, in a direction from a position close to the base substrate and a position away from the base substrate, the pixel defining layer includes a first pixel defining layer, a conductive layer and a second pixel defining layer which are stacked, in the pixel defining layer in at least the peripheral region of the display substrate, an orthographic projection of the conductive layer on the base substrate completely falls into an orthographic projection of the second pixel defining layer on the base substrate; an electroluminescent unit located in the openings, the electroluminescent unit includes a light emitting layer and a transparent electrode on a side of the light emitting layer away from the base substrate, and the transparent electrode is electrically connected with the conductive layer in the pixel defining layer in at least the peripheral region of the display substrate. In the display substrate, by electrically connecting the transparent electrode with the conductive layer included in the pixel defining layer, the voltage drop of the transparent electrode located at an edge of the display substrate can be effectively reduced, thereby facilitating achieving the uniformity of the voltage drop of the transparent electrode, so as to improve picture quality uniformity and serve life of the display device.

Hereinafter, the display substrate, the manufacturing method thereof, and the display device provided by the embodiments of the present disclosure will be described with reference to the accompanying drawings.

Figure 1A:
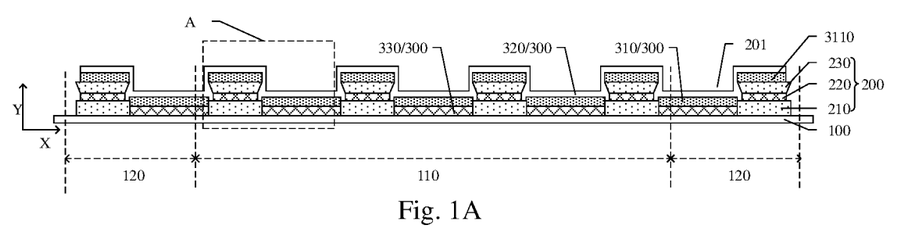
FIG. 1A is a schematic diagram of a cross section of a display substrate provided by an embodiment of the present disclosure.
Figure 1B:
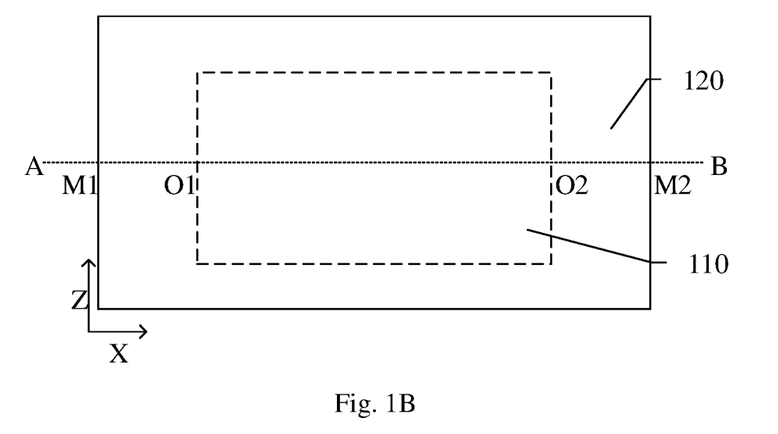
FIG. 1B is a schematic plan view of the display substrate illustrated by FIG. 1A.

An embodiment of the present disclosure provides a display substrate. FIG. 1A is a schematic diagram of a cross section of a display substrate according to an embodiment of the present disclosure, and FIG. 1B is a schematic plan view of the display substrate illustrated by FIG. 1A. As illustrated by FIG. 1A, the display substrate provided in this embodiment includes a base substrate 100; a pixel defining layer 200 on the base substrate 100, the pixel defining layer 200 includes a plurality of openings 201 (including, for example, an array of openings 201), in a direction from a position close to the base substrate 100 to a position away from the base substrate 100, that is, in a direction indicated by an arrow in the Y direction as illustrated by FIG. 1A, the pixel defining layer 200 sequentially includes a first pixel defining layer 210, a conductive layer 220, and a second pixel defining layer 230 which are stacked; an orthographic projection of a portion of the conductive layer 220 in at least a peripheral region 120 at the periphery of the display substrate on the base substrate 100 completely falls in an orthographic projection of the second pixel defining layer 230 on the base substrate 100, that is, in the pixel defining layer 200 in at least the peripheral region 120 of the display substrate, the orthographic projection of the conductive layer 220 on the base substrate 100 completely falls within the orthographic projection of the second pixel defining layer 230 on the base substrate 100.

As illustrated by FIG. 1B, the display substrate provided in this embodiment includes a middle portion 110 and a peripheral region 120 located around the middle portion 110. A ratio of a length of the middle portion 110 along the AB line to a length of the peripheral region 120 along the AB line ranges from 0.5 to 4. Herein, "the length of the peripheral region 120 along the AB line" refers to a sum of lengths of the peripheral regions 120 located on both sides of the middle portion 110 in the direction of the AB line. As illustrated by FIG. 1B, two intersections of the AB line and edge lines of the middle portion 110 (the dotted line frame at the middle) are O1 and O2, respectively, and intersections of the AB line and edge lines of the peripheral region 120 (the solid line frame at the periphery) are M1 and M2, respectively. Thus, "the length of the peripheral region 120 along the AB line" refers to a sum of the length of M1O1 line and the length of M2O2 line. Therefore, the ratio of the length of the middle portion 110 along the AB line to the length of the peripheral region 120 along the AB line is the ratio of the length of the O1O2 line to the sum of the length of the M1O1 line and the length of the M2O2 line. For example, the ratio of the length of the middle portion 110 along the AB line to the length of the peripheral portion 120 along the AB line is 3:2 or 2:3.

Further, the above-mentioned "completely falling within" means that a size of the conductive layer 220 between adjacent openings 201 is smaller than the maximum size of the second pixel defining layer 230 in a direction parallel to the base substrate 100 (for example, the X direction). FIG. 1A illustrates an example in which the orthographic projection of the entire conductive layer 220 included in the pixel defining layer 200 at any positions on the base substrate 100 completely falls within the orthographic projection of the second pixel defining layer 230 on the base substrate 100.

As illustrated by FIG. 1A and FIG. 1B, the display substrate provided in this embodiment further includes an electroluminescent unit 300 located in the opening 201. The electroluminescent unit 300 includes a light emitting layer 310 and a transparent electrode 320 on a side of the light emitting layer 310 away from the base substrate 100, and the transparent electrode 320 is electrically connected with a portion of the conductive layer 220 in at least the peripheral region 120 located at the edges of the display substrate, that is, the transparent electrode 320 is electrically connected with the conductive layer 220 in the pixel defining layer 200 in at least the peripheral region 120 of the display substrate. FIG. 1A illustrates an example in which the entire conductive layer 220 is electrically connected with the transparent electrode 320, that is, the conductive layer located in the middle portion and the peripheral region of the display substrate are electrically connected with the transparent electrode.

The display substrate provided in this embodiment is a large-size display substrate. Generally, the light emitting layer 310 in the electroluminescent unit 300 is formed by an evaporation method, and upon the light emitting layer 310 being formed by the evaporation method, a light emitting material layer is evaporated both in the openings 201 and on the second pixel defining layer 230. The light emitting material layer located in the openings 201 can be used for illumination, so that the light emitting material layer located in the openings becomes a light emitting layer 310, and the light emitting material 3110 located on the second pixel defining layer 230 is not used for illumination, that is, a side of the second pixel defining layer 230 away from the base substrate 100 is provided with the light emitting material layer 3110, and the material of the light emitting material layer 3110 is the same as the material of the light emitting layer 310. Further, the transparent electrode 320 is a continuous electrode layer on the entire surface of the light emitting layer 310 and the light emitting material layer 3110.

As illustrated by FIG. 1A, in a case where the orthographic projection of the entire conductive layer 220 on the base substrate 100 completely falls within the orthographic projection of the second pixel defining layer 230 on the base substrate 100, the evaporated light emitting layer 310 does not cover a lateral surface of the conductive layer 220. In this case, the transparent electrode 320 deposited by an atomic layer deposition method can be deposited on the lateral surface of the conductive layer 220 and in contact with the lateral surface of the conductive layer 220, thereby achieving an electrical connection between the transparent electrode 320 and the conductive layer 220. Therefore, in the display substrate, by electrically connecting the transparent electrode with the conductive layer included in the pixel defining layer, a voltage drop of the transparent electrode can be effectively reduced, and the uniformity of voltage drop on the transparent electrode can be achieved, thereby improving the picture quality uniformity and serve life of the display device.

For example, as illustrated by FIG. 1A, a cross section of the second pixel defining layer 230 has a trapezoid shape, and a length of a base of the trapezoid shape away from the base substrate 100 is greater than a length of a base of the trapezoid shape close to the base substrate 100. That is, the cross section of the second pixel defining layer 230 has an inverted trapezoid shape. The long base of the inverted trapezoid shape is used to prevent the light emitting layer 310 from being evaporated on the conductive layer 220, that is, a surface of a side of the second pixel defining layer 230 away from the base substrate 100 is used for preventing the light emitting layer 310 from being evaporated on the conductive layer 220. FIG. 1A illustrates an example in which the cross section of the second pixel defining layer 230 taken along the XY plane has an inverted trapezoid shape. For example, a cross section of the second pixel defining layer 230 taken along the YZ plane illustrated by FIGS. 1A and 1B also has an inverted trapezoid.

For example, as illustrated by FIG. 1A, a surface of the conductive layer 220 facing the second pixel defining layer 230 has the same shape and size with a surface of the second pixel defining layer 230 facing the conductive layer 220, that is, an orthographic projection of a surface of the conductive layer 220 facing the second pixel defining layer 230 on the base substrate 100 coincides with an orthographic projection of a surface of the second pixel defining layer 230 facing the conductive layer 220 on the base substrate 100. For example, in the X direction, a size of the conductive layer 220 is the same as a length of an edge of a side of the second pixel defining layer 230 facing the base substrate 100. The "same" in the above-mentioned "a surface of the conductive layer 220 facing the second pixel defining layer 230 has the same shape and size with a surface of the second pixel defining layer 230 facing the conductive layer 220" includes a completely same case and a substantially same case, and the substantially same case refers to that deviations of the shapes and sizes of the two are not more than 2%.

Figure 1C:
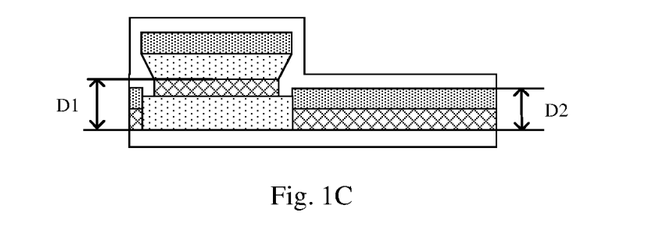
FIG. 1C is a schematic enlarged diagram of region A of the display substrate illustrated by FIG. 1A.

For example, FIG. 1C is a schematic enlarged view of region A of the display substrate illustrated by FIG. 1A. As illustrated by FIG. 1A and FIG. 1C, a distance D1 between the surface of the second pixel defining layer 230 facing the conductive layer 220 and the base substrate 100 is greater than a distance D2 between the surface of the light emitting layer 310 located in the openings 201 away from the base substrate 100 and the base substrate 100. Thus, the evaporated light emitting layer 310 does not cover the lateral surface of the conductive layer 220, that is, in the X direction, the lateral surface of the light emitting layer 310 and the lateral surface of the conductive layer 220 have a certain distance. The transparent electrode 320 may be deposited into a gap between the conductive layer 220 and the light emitting layer 310 and in contact with the conductive layer 220 to achieve the electrical connection between the transparent electrode 320 and the conductive layer 220.

For example, as illustrated by FIG. 1A, the orthographic projection of the first pixel defining layer 210 on the base substrate 100 coincides with the orthographic projection of the second pixel defining layer 230 on the base substrate 100, that is, the first pixel defining layer 210 and the second pixel defining layer 230 can be patterned by using the same mask, thereby saving the number of masks. Herein, "coincides with" includes "completely coincides with" and "substantially coincides with".

For example, as illustrated by FIG. 1A, the orthographic projection of conductive layer 220 on base substrate 100 falls within an orthographic projection of first pixel defining layer 210 on base substrate 100. For example, the orthographic projection of conductive layer 220 on base substrate 100 may completely fall within the orthographic projection of first pixel defining layer 210 on base substrate 100.

For example, as illustrated by FIG. 1A, a thickness distribution of the conductive layer 220 in a direction perpendicular to the base substrate 100 (i.e., the Y direction) is uniform, that is, the thickness of the conductive layer 220 located at any position in the pixel defining layer 200 is the same.

For example, as illustrated by FIG. 1A, the electroluminescent unit 300 further includes a reflective electrode 330 on a side of the light emitting layer 310 facing the base substrate 100; that is, the reflective electrode 330 is located in the openings 201. The electroluminescent unit provided in this embodiment is a top emitting unit. Therefore, the display substrate in this embodiment is a display substrate including a top emitting electroluminescent unit.

For example, a material of the conductive layer 220 may be the same as a material of the reflective electrode 330. For example, the material of the conductive layer 220 may include a conductive metal material such as silver or molybdenum, so that the conductivity of the transparent electrode electrically connected thereto can be improved to effectively reduce the voltage drop of the transparent electrode.

Figure 2A:
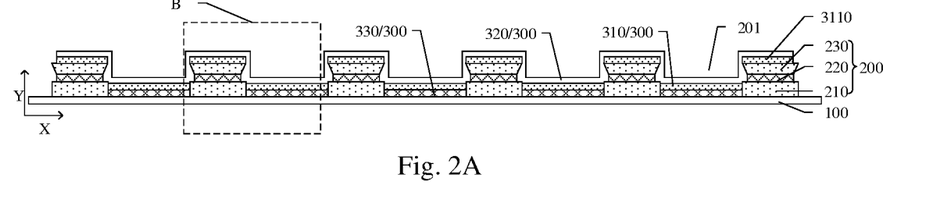
FIG. 2A is a schematic diagram of a cross section of a display substrate provided by an example of the present embodiment.
Figure 2B:
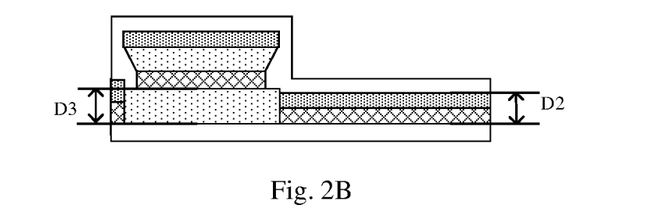
FIG. 2B is a schematic enlarged diagram of region B of the display substrate illustrated by FIG. 2A.

For example, FIG. 2A is a schematic diagram of a cross section of a display substrate provided by an example of the embodiment, and FIG. 2B is a schematic diagram of an enlarged view of region B of the display substrate illustrated in FIG. 2A. As illustrated by FIG. 2A and FIG. 2B, a distance D3 between a surface of the first pixel defining layer 210 facing the conductive layer 220 and the base substrate 100 is greater than the distance D2 between a surface of the light emitting layer 310 located in the openings 201 away from the base substrate 100 and the base substrate 100. That is, in the Y direction, the surface of the light emitting layer 310 away from the base substrate 100 is lower than the surface of the conductive layer 220 facing the base substrate 100. Therefore, the light emitting layer 310 does not cover the lateral surface of the conductive layer 220 during the evaporation process. In this case, the transparent electrode 320 can be deposited on the lateral surface of the conductive layer 220 to achieve the electrical connection of the transparent electrode 320 and the conductive layer 220.

Figure 3A:
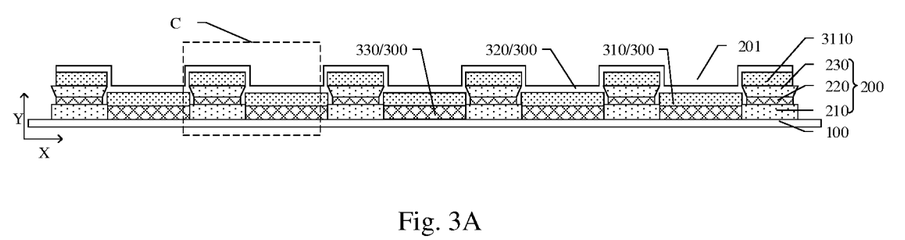
FIG. 3A is a schematic diagram of a cross section of a display substrate provided by another example of the present embodiment.
Figure 3B:
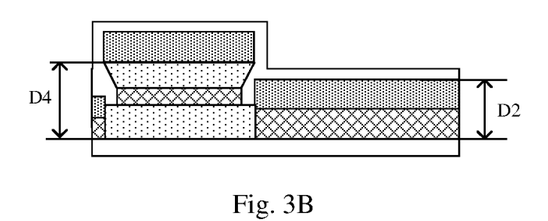
FIG. 3B is a schematic enlarged diagram of region C of the display substrate illustrated by FIG. 3A.

For example, FIG. 3A is a schematic diagram of a cross section of a display substrate provided by another example of the embodiment, and FIG. 3B is a schematic diagram of an enlarged view of region C of the display substrate illustrated in FIG. 3A. As illustrated by FIG. 3A and FIG. 3B, a distance D4 between a surface of the second pixel defining layer 230 away from the conductive layer 220 and the base substrate 100 is greater than the distance D2 between the surface of the light emitting layer 310 located in the openings 201 away from the base substrate 100 and the base substrate 100. It should be noted that a cross section of the second pixel defining layer 230 has a trapezoid shape in this case, and the length of a base of the cross section away from the base substrate 100 must be larger than the length of a base of the cross section close to the base substrate 100 (i.e., the cross section is an inverted trapezoid) such that the evaporated light emitting layer 310 does not cover the lateral surface of the conductive layer 220, so that the transparent electrode 320 can be deposited into a gap between the light emitting layer 310 and the conductive layer 220, and in contact with the lateral surface of the conductive layer 220, thereby achieving the electrical connection of the transparent electrode 320 and the conductive layer 220.

Figure 4A:
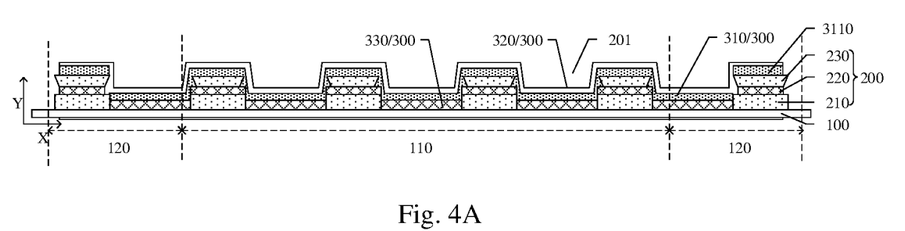
FIG. 4A is a schematic diagram of a cross section of a display substrate provided by another example of the present embodiment.

For example, FIG. 4A is a schematic diagram of a cross section of a display substrate provided by another example of the embodiment. FIG. 4A illustrates an example in which an orthographic projection of a portion of the conductive layer 220 only in the peripheral region 120 located at peripheral edges of the display substrate on the base substrate 100 completely falls within the orthographic projection of the second pixel defining layer 230 on the base substrate 100. That is, the orthographic projection portion of a portion of the conductive layer 220 located at the middle portion 110 of the display substrate on the base substrate 100 partially falls within the orthographic projection of the second pixel defining layer 230 on the base substrate 100. Therefore, a lateral surface of the portion of the conductive layer 220 located at the middle portion 110 will be covered by the light emitting layer 310, and the transparent electrode 320 located on the side of the light emitting layer 310 away from the base substrate 100 is not electrically connected with the portion of the conductive layer 220. Therefore, in case where the thickness of the transparent electrode 320 located in the middle portion 110 of the display substrate is greater than the thickness of the transparent electrode 320 located in the peripheral region 120 of the display substrate, which causes the voltage drop of the transparent electrode 320 of the peripheral region 120 of the display substrate to be relatively large, by only electrically connecting the portion of the conductive layer 220 located in peripheral region 120 located at the peripheral edges of the display substrate with the transparent electrode 320, that is, the transparent electrode 320 is only electrically connected with the conductive layer 220 in the pixel defining layer 200 located in the peripheral region 120 of the display substrate, the problem that the voltage drop of the transparent electrode 320 located at the edges of the display substrate is relatively large can be well solved. At the same time, the above-mentioned arrangement can also solve the problem of uneven voltage drop of the transparent electrode located on the entire display substrate.

The present embodiment is not limited thereto, for example, in addition to the case where the orthographic projection of the portion of the conductive layer located in the peripheral region located at the peripheral edges of the display substrate on the base substrate completely falls within the orthographic projection of the second pixel defining layer on the base substrate, an orthographic projection of a part of the conductive layer located at the middle portion of the display substrate may completely fall within the orthographic projection of the second pixel defining layer on the base substrate. In this case, the voltage drop of the transparent electrode can also be reduced.

Figure 4B:
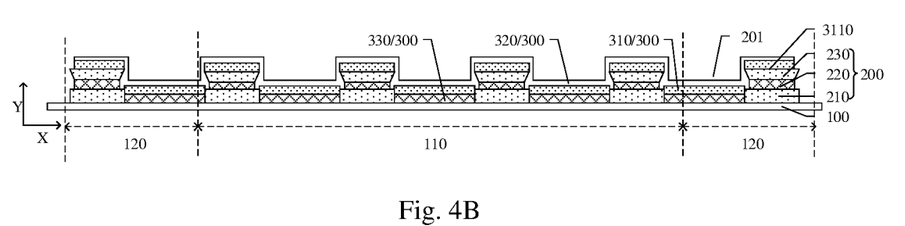
FIG. 4B is a schematic diagram of a cross section of a display substrate provided by another example of the present embodiment.

For example, FIG. 4B is a schematic diagram of a cross section of a display substrate provided by another example of the embodiment. As illustrated by FIG. 4B, a thickness of a portion of the transparent electrode 320 located at the middle portion 110 of the display substrate in a direction perpendicular to the base substrate 100 is larger than a thickness of a portion of the transparent electrode 320 located at the peripheral portion 120 of the display substrate in a direction perpendicular to the base substrate 100. Also, a thickness of a portion of the conductive layer 220 located at the middle portion 110 of the display substrate in a direction perpendicular to the base substrate 100 is smaller than a thickness of a portion of the conductive layer 220 located at the peripheral region 120 of the display substrate in a direction perpendicular to the base substrate 100. In this example, the thickness of the conductive layer located in the peripheral region is relatively thick, on the one hand, the problem that the thickness of the entire display substrate is uneven caused by the thickness of the transparent electrode located in the peripheral region being relatively thin can be solved, and on the other hand, the voltage drop of the transparent electrode located in the peripheral region can be better reduced, thereby solving the problem of uneven voltage drop of the transparent electrode located on the entire base substrate.

Figure 5:
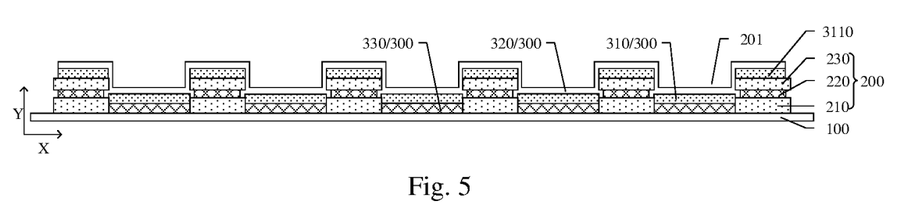
FIG. 5 is a schematic diagram of a cross section of a display substrate provided by another example of the present embodiment.

For example, FIG. 5 is a schematic diagram of a cross section of a display substrate provided by another example of the embodiment. As illustrated by FIG. 5, a cross section of the second pixel defining layer 230 in the display substrate has a rectangular shape, and in a direction parallel to the base substrate 100, a size of the second pixel defining layer 230 is larger than that of the conductive layer 220, such that an orthographic projection of conductive layer 220 on base substrate 100 completely falls within the orthographic projection of second pixel defining layer 230 on base substrate 100. For example, in the X direction as illustrated by the drawing, a size of the second pixel defining layer 230 is larger than a size of the conductive layer 220.

Figure 6:
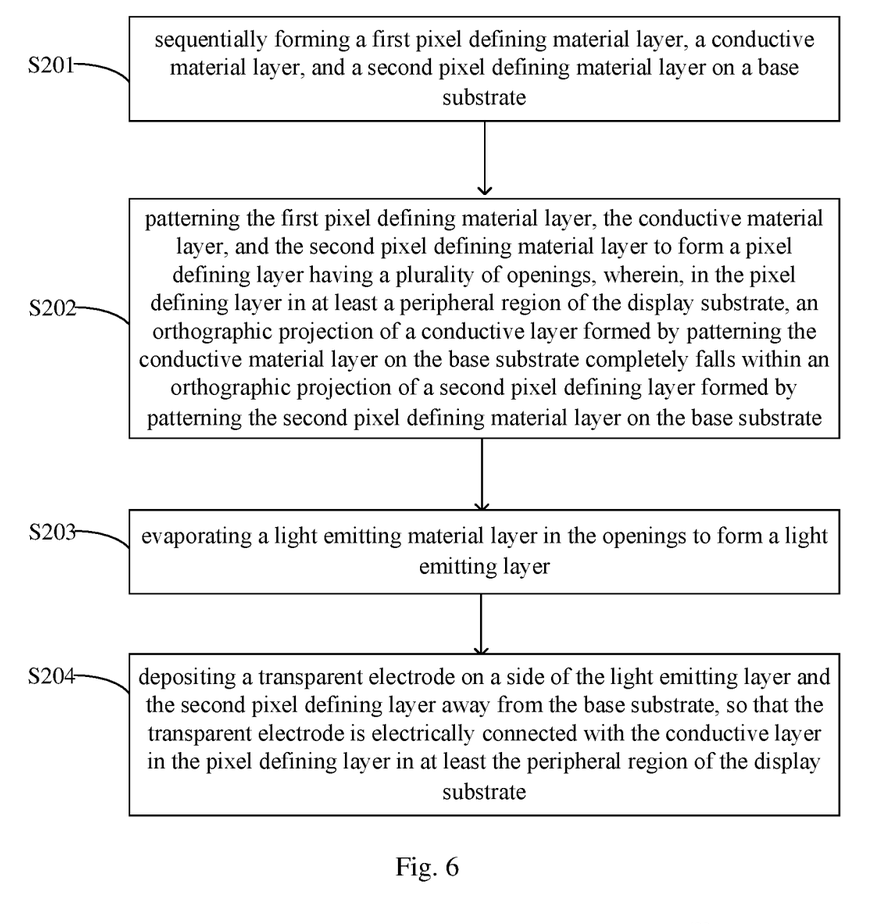
FIG. 6 is a schematic flowchart of a manufacturing method of a display substrate provided by an embodiment of the present disclosure.

An embodiment of the present disclosure provides a manufacturing method of a display substrate, and FIG. 6 is a schematic flowchart of a manufacturing method of a display substrate according to an embodiment of the present disclosure. As illustrated by FIG. 6, the specific steps are provided as follows:

S201: sequentially forming a first pixel defining material layer, a conductive material layer, and a second pixel defining material layer on a base substrate.

For example, before forming the first pixel defining material layer, a reflective electrode material layer is deposited on the base substrate and patterned to form a reflective electrode.

For example, a material of the reflective electrode may include a conductive material such as indium tin oxide/silver/indium tin oxide.

For example, after the reflective electrode is formed, the first pixel defining material layer, the conductive material layer, and the second pixel defining material layer are sequentially formed on the base substrate.

For example, the first pixel defining material layer is coated on the base substrate, then the conductive material layer is formed on the first pixel defining material layer by sputtering or deposition, and finally the second pixel defining material layer is coated on the conductive material layer.

S202: patterning the first pixel defining material layer, the conductive material layer, and the second pixel defining material layer to form a pixel defining layer having a plurality of openings, wherein, in the pixel defining layer in at least a peripheral region of the display substrate, an orthographic projection of a conductive layer formed by patterning the conductive material layer on the base substrate completely falls within an orthographic projection of a second pixel defining layer formed by patterning the second pixel defining material layer on the base substrate.

For example, the second pixel defining material layer can be etched and patterned by using a mask to form the second pixel defining layer having a plurality of openings.

For example, the second pixel defining material layer may be wet etched such that a cross section of the second pixel defining layer has an inverted trapezoid shape. Herein, the "inverted trapezoid shape" refers to that the length of a base of the cross section of the second pixel defining layer away from the base substrate is greater than the length of a base of the cross section close to the base substrate.

For example, the cross section of the second pixel defining layer may also have a rectangle shape.

For example, after the second pixel defining layer is formed by patterning, the conductive material layer is patterned to form a conductive layer having the same shape as the openings, and an orthographic projection of a portion of the conductive layer located in at least a peripheral region of the display substrate on the base substrate completely falls within an orthographic projection of the second pixel defining layer on the base substrate, that is, in a direction parallel to the base substrate, a size of the conductive layer between adjacent openings is smaller than the maximum size of the second pixel defining layer.

For example, a thickness distribution of the conductive layer in a direction perpendicular to the base substrate is uniform.

For example, a thickness of a portion of the conductive layer located at a middle portion of the display substrate in a direction perpendicular to the base substrate is smaller than a thickness of a portion of the conductive layer at a peripheral portion located at the peripheral edges of the display substrate in a direction perpendicular to the base substrate.

For example, after the conductive layer is formed by patterning, the first pixel defining material layer may be patterned by using a mask to form the first pixel defining layer having the same shape as the openings described above, and the openings are used for exposing the reflective electrode. Therefore, the first pixel defining layer, the conductive layer, and the second pixel defining layer constitute a pixel defining layer having a plurality of openings.

For example, the shape and size of the first pixel defining layer are the same as the shape and size of the second pixel defining layer, that is, the orthographic projection of the first pixel defining layer on the base substrate completely coincides with the orthographic projection of the second pixel defining layer on the base substrate. Thus, the present embodiment may use the same mask to pattern the first pixel defining layer and the second pixel defining layer to save the number of masks, but is not limited thereto.

For example, the shape and size of the first pixel defining layer may also be different from the shape and size of the second pixel defining layer, that is, the orthographic projection of the first pixel defining layer on the base substrate partially coincides with the orthographic projection of the second pixel defining layer on the base substrate.

For example, a material of the first pixel defining layer is the same as a material of the second pixel defining layer.

For example, in this embodiment, a reflective electrode may be formed directly in the openings after the pixel defining layer is formed.

S203: evaporating a light emitting material layer in the openings to form a light emitting layer.

For example, the light emitting material layer can be evaporated in the openings and on the second pixel defining layer.

The display substrate manufactured in this embodiment is a large-sized electroluminescent display substrate, and thus the light emitting material layer is formed by evaporation, a portion of the light emitting material layer is evaporated in the openings to form a light emitting layer of an electroluminescent unit, and the light emitting layer is in contact with the reflective electrode, and the other portion of the light emitting material layer is evaporated on the second pixel defining layer and is not used for illumination.

For example, in a case where the orthographic projection of the entire conductive layer on the base substrate completely falls within the orthographic projection of the second pixel defining layer on the base substrate, the evaporated light emitting layer does not cover the lateral surface of the conductive layer.

For example, only an orthographic projection of a portion of the conductive layer in the peripheral region located at the peripheral edges of the display substrate on the base substrate completely falls within the orthographic projection of the second pixel defining layer on the base substrate, that is, an orthographic projection of a portion of the conductive substrate located at the middle portion of the display substrate on the base substrate does not fall within the orthographic projection of the second pixel defining layer on the base substrate, and therefore, the lateral surface of the portion of the conductive layer located at the middle portion of the conductive layer is covered by the light emitting layer, and the lateral surface of the portion of the conductive layer located in the peripheral region is not covered by the light emitting layer.

For example, a distance between a surface of the second pixel defining layer facing the conductive layer and the base substrate is greater than a distance between a surface of the light emitting layer located in the openings away from the base substrate and the base substrate, whereby the evaporated light emitting layer does not cover the lateral surface of the conductive layer.

For example, a distance between a surface of the first pixel defining layer facing the conductive layer and the base substrate is greater than the distance of the surface of the light emitting layer located in the openings away from the base substrate and the base substrate, whereby the evaporated light emitting layer does not cover the lateral surface of the conductive layer.

For example, in a case where the cross section of the second pixel defining layer has an inverted trapezoid shape, the distance between the surface of the second pixel defining layer away from the conductive layer and the base substrate is greater than the distance between the surface of the emitting layer located in the openings away from the base substrate and the base substrate. Whereby the evaporated light emitting layer does not cover the lateral surface of the conductive layer.

S204: depositing a transparent electrode on a side of the light emitting layer and the second pixel defining layer away from the base substrate, so that the transparent electrode is electrically connected with the conductive layer in the pixel defining layer in at least the peripheral region of the display substrate.

For example, the electroluminescent unit manufactured in this embodiment is a top emitting unit.

For example, the transparent electrode can be deposited by using an atomic layer deposition apparatus.

In the case where the orthographic projection of the conductive layer on the base substrate completely falls within the orthographic projection of the second pixel defining layer on the base substrate, the evaporated light emitting layer does not cover the lateral surface of the conductive layer. The transparent electrode deposited by the atomic layer deposition method may be deposited on the lateral surface of the conductive layer and in contact with the conductive layer, thereby achieving an electrical connection of the transparent electrode and the conductive layer. Therefore, at one aspect, in the display substrate, upon the thickness of the transparent electrode located at the middle portion of the display substrate is greater than the thickness of the transparent electrode located in the peripheral portion of the display substrate, causing a relatively large voltage drop of the transparent electrode in the peripheral region of the display substrate, by electrically connecting the transparent electrode with a portion of the conductive layer, included in the pixel defining layer, in at least the peripheral region (for example, the transparent electrode is electrically connected with a portion of the conductive layer only in the peripheral region, or the transparent electrode is electrically connected with the conductive layer located both at the middle portion and in the peripheral region, but the thickness of the conductive layer located at the middle portion is smaller than the thickness of the conductive layer located in the peripheral region), the voltage drop of the transparent electrode located at the edges of the display substrate can be effectively reduced, thereby facilitating achieving the uniformity of the voltage drop on the transparent electrode. At another aspect, the transparent electrode is electrically connected with the conductive layers both located at the middle portion and in the peripheral region, and the voltage drop of the entire transparent electrode can also be reduced.

Compared with the vacuum evaporation and sputtering method, the atomic layer deposition has excellent step coverage and can be deposited into the gap between an edge of the conductive layer and an edge of the light emitting layer, which can promote the conduction between the transparent electrode and the conductive layer, thereby achieving reducing the voltage drop of the transparent electrode, so as to improve the picture quality uniformity and serve life of the display device. Besides, the atomic layer deposition method can realize the production of a film having optical characteristics such as different refractive indexes by adjusting a ratio of the precursors according to the requirements of the device.

Figure 7:
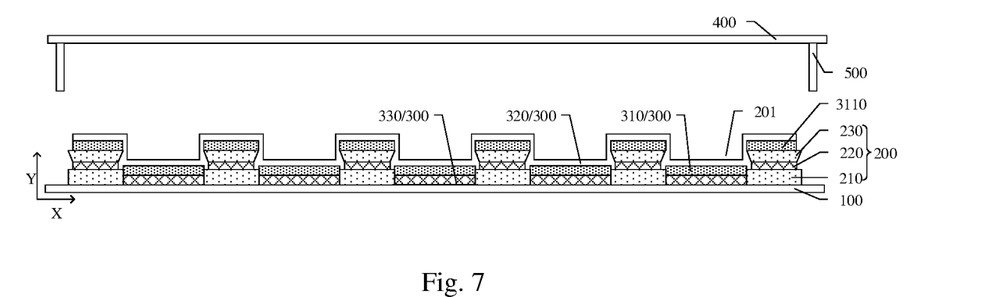
FIG. 7 is a schematic partial structural diagram of a display device including the above-mentioned display substrate provided by an embodiment of the present disclosure.

An embodiment of the present disclosure provides a display device. FIG. 7 is a schematic partial structural diagram of a display device including the above-mentioned display substrate provided by an embodiment of the present disclosure. As illustrated by FIG. 7, the display device further includes a cover plate 400 and an encapsulation sealant 500 that encapsulates the cover plate 400 onto the display substrate.

For example, the cover plate 400 may be made of glass or a flexible film to block water and oxygen in a direction parallel to the base substrate 100, thereby protecting the electroluminescent unit.

For example, the encapsulation sealant 500 can be applied by a dispenser, so as to play a role of laterally block water and oxygen and protect the electroluminescent unit.

By using the display substrate in the above-mentioned embodiments, the voltage drop of the transparent electrode can be reduced, and the picture quality uniformity and serve life of the display device can be improved.

For example, the display device may be a display device such as an organic light emitting diode (OLED) display device, and a product or component having a display function, such as a television, a digital camera, a mobile phone, a watch, a tablet computer, a notebook computer, a navigation device, etc., and the present embodiment is not limited thereto.

The following statements should be noted:

(1) unless otherwise defined, in embodiment(s) and accompanying drawings of the present disclosure, the same reference sign indicates the same meaning, (2) The drawings accompanying the embodiment(s) of the present disclosure involve only the structure(s) in connection with the embodiment(s) of the present disclosure, and other structure(s) can be referred to common design(s).

(3) For the purpose of clarity only, in accompanying drawings for illustrating the embodiment(s) of the present disclosure, the thickness of a layer or an area may be enlarged. It should understood that, in the case in which a component such as a layer, film, area, substrate or the like is referred to be "on" or "under" another component, it may be directly on or under the another component, or a component may be interposed therebetween.

The above are merely specific implementations of the present disclosure without limiting the protection scope of the present disclosure thereto. Within the technical scope revealed in the present disclosure, modification(s) or substitution(s) may be easily conceivable for those skilled who are familiar with the present technical field, and these modification(s) and substitution(s) all should be contained in the protection scope of the present disclosure. Therefore the protection scope of the present disclosure should be based on the protection scope of the appended claims.

What is claimed is:

1. A display substrate, comprising:
a base substrate;
a pixel defining layer on the base substrate, the pixel defining layer comprising a plurality of openings, wherein, in a direction from a position close to the base substrate to a position away from the base substrate, the pixel defining layer comprises a first pixel defining layer, a conductive layer, and a second pixel defining layer which are stacked, in the pixel defining layer in at least a peripheral region of the display substrate, an orthographic projection of the conductive layer on the base substrate completely falls within an orthographic projection of the second pixel defining layer on the base substrate; and
an electroluminescent unit, located in the openings, the electroluminescent unit comprising a light emitting layer and a transparent electrode on a side of the light emitting layer away from the base substrate,
wherein the transparent electrode is electrically connected with the conductive layer in the pixel defining layer in at least the peripheral region of the display substrate,
wherein a cross section of the second pixel defining layer has a trapezoid shape, and a length of a base of the trapezoid shape away from the base substrate is greater than a length of a base of the trapezoid shape close to the base substrate,
wherein a surface of the conductive layer facing the second pixel defining layer and a surface of the second pixel defining layer facing the conductive layer are the same in shape and size.

2. The display substrate according to claim 1, wherein an orthographic projection of the entire conductive layer on the base substrate completely falls within the orthographic projection of the second pixel defining layer on the base substrate.

3. The display substrate according to claim 1, wherein a distance between a surface of the second pixel defining layer facing the conductive layer and the base substrate is greater than a distance between a surface of the light emitting layer in the openings away from the base substrate and the base substrate.

4. The display substrate according to claim 1, wherein a distance between a surface of the first pixel defining layer facing the conductive layer and the base substrate is greater than a distance between a surface of the light emitting layer in the openings away from the base substrate and the base substrate.

5. The display substrate according to claim 1, wherein a distance between a surface of the second pixel defining layer away from the conductive layer and the base substrate is greater than a distance between a surface of the light emitting layer in the openings away from the base substrate and the base substrate.

6. The display substrate according to claim 1, wherein an orthographic projection of the first pixel defining layer on the base substrate coincides with the orthographic projection of the second pixel defining layer on the base substrate.

7. The display substrate according to claim 1, wherein a thickness of the conductive layer in a direction perpendicular to the base substrate is uniformly distributed.

8. The display substrate according to claim 1, wherein, in a direction perpendicular to the base substrate, a thickness of a portion of the transparent electrode located at a middle portion of the display substrate is greater than a thickness of a portion of the transparent electrode located in the peripheral region of the display substrate.

9. The display substrate according to claim 8, wherein a portion of the conductive layer is located at the middle portion of the display panel, and in a direction perpendicular to the base substrate, a thickness of the portion of the conductive layer located at the middle portion of the display substrate is smaller than a thickness of a portion of the conductive layer located in the peripheral region of the display substrate.

10. The display substrate according to claim 8, wherein the transparent electrode is electrically connected with the conductive layer in the pixel defining layer only in the peripheral region of the display substrate.

11. The display substrate according to claim 1, wherein a side of the second pixel defining layer away from the base substrate is provided with a light emitting material layer, a material of the light emitting material layer is the same with a material of the light emitting layer, and the transparent electrode is a continuous electrode layer on the entire surface of the light emitting layer and the light emitting material layer.

12. The display substrate according to claim 1, wherein the electroluminescent unit further comprises a reflective electrode on a side of the light emitting layer facing the base substrate.

13. The display substrate according to claim 12, wherein a material of the conductive layer is the same as a material of the reflective electrode.

14. A display device, comprising the display substrate according to claim 1.

15. A manufacturing method of a display substrate, comprising:

forming a first pixel defining material layer, a conductive material layer, and a second pixel defining material layer on a base substrate;

patterning the first pixel defining material layer, the conductive material layer, and the second pixel defining material layer to form a pixel defining layer having a plurality of openings, wherein, in the pixel defining layer in at least a peripheral region of the display substrate, an orthographic projection of a conductive layer formed by patterning the conductive material layer on the base substrate completely falls within an orthographic projection of a second pixel defining layer formed by patterning the second pixel defining material layer on the base substrate;

evaporating a light emitting material layer in the openings to form a light emitting layer; and depositing a transparent electrode on a side of the light emitting layer and the second pixel defining layer away from the base substrate, such that the transparent electrode is electrically connected with the conductive layer in the pixel defining layer in at least the peripheral region of the display substrate, wherein forming a first pixel defining layer and the second pixel defining layer comprises: forming the first pixel defining layer and the second pixel defining layer by using a same mask pattern.

16. The manufacturing method of the display substrate according to claim 15, wherein using an atomic layer deposition method to deposit the transparent electrode.

17. The manufacturing method of the display substrate according to claim 15, wherein, before forming the pixel defining layer, forming a reflective electrode on the base substrate, wherein the openings expose the reflective electrode.

* * * * *